(12) United States Patent
Kang et al.

(10) Patent No.: US 8,742,247 B2
(45) Date of Patent: Jun. 3, 2014

(54) SOLAR CELL MODULE AND METHOD OF MANUFACTURING THE SAME

(75) Inventors: Ku-Hyun Kang, Yongin (KR); Dong-Jin Kim, Yongin (KR); Yeon-Il Kang, Yongin (KR); Czang-Ho Lee, Yongin (KR); Myung-Hun Shin, Yongin (KR); Dae-Ha Woo, Yongin (KR); Byoung-Kyu Lee, Yongin (KR); Yuk-Hyun Nam, Yongin (KR); Seung-Jae Jung, Yongin (KR); Joong-Hyun Park, Yongin (KR)

(73) Assignee: Samsung SDI Co., Ltd., Yongin-Si, Gyeonggi-Do (KR)

( * ) Notice: Subject to any disclaimer, the term of this patent is extended or adjusted under 35 U.S.C. 154(b) by 515 days.

(21) Appl. No.: 12/629,847

(22) Filed: Dec. 2, 2009

(65) Prior Publication Data
US 2010/0193006 A1 Aug. 5, 2010

(30) Foreign Application Priority Data
Jan. 30, 2009 (KR) ........................ 10-2009-0007218

(51) Int. Cl.
*H01L 31/042* (2014.01)
*H01L 31/00* (2006.01)

(52) U.S. Cl.
USPC ......................................... 136/244; 136/252

(58) Field of Classification Search
USPC .................................. 136/243, 244, 252, 256
See application file for complete search history.

(56) References Cited

U.S. PATENT DOCUMENTS

| | | | | |
|---|---|---|---|---|
| 6,455,347 | B1 * | 9/2002 | Hiraishi et al. | 438/80 |
| 6,578,764 | B1 * | 6/2003 | Hiraishi et al. | 235/454 |
| 2009/0056801 | A1 * | 3/2009 | Chun-Hsiung et al. | 136/256 |
| 2009/0229653 | A1 * | 9/2009 | Lu et al. | 136/249 |

FOREIGN PATENT DOCUMENTS

| | | |
|---|---|---|
| JP | 2002-16269 | 1/2002 |
| JP | 2008-066453 | 3/2008 |
| JP | 2008-113053 | 5/2008 |

\* cited by examiner

*Primary Examiner* — Alexander Kollias
(74) *Attorney, Agent, or Firm* — Lee & Morse, P.C.

(57) ABSTRACT

A solar cell module includes a substrate, a lower electrode layer, a semiconductor layer and an upper electrode layer for an embodiment. The lower electrode layer may include a plurality of area-separating grooves separating the substrate into an active area and a peripheral area surrounding the active area, and a plurality of first cell-separating grooves formed in the active area. The semiconductor layer is formed on the lower electrode layer. The semiconductor layer includes a plurality of second cell-separating grooves that are spaced apart from the first cell-separating grooves. The upper electrode layer is formed on the semiconductor layer. The upper electrode layer includes a plurality of third cell-separating grooves that are spaced apart from the second separating grooves.

6 Claims, 8 Drawing Sheets

SOLAR CELL MODULE AND METHOD OF MANUFACTURING THE SAME

PRIORITY STATEMENT

This application claims priority under 35 U.S.C. §119 to Korean Patent Application No. 2009-7218, filed on Jan. 30, 2009 in the Korean Intellectual Property Office (KIPO), the contents of which are herein incorporated by reference in their entirety.

BACKGROUND

1. Technical Field

Example embodiments of the present invention generally relate to a solar cell module and a method of manufacturing the solar cell module. More particularly, example embodiments of the present invention relate to a solar cell module which converts light energy into electric energy and a method of manufacturing the solar cell module.

2. Description of the Related Art

Generally, a solar cell is a device which converts light energy into electric energy by using a photovoltaic effect. The solar cell is classified as a silicon solar cell, a thin-film solar cell, a dye-sensitized solar cell, an organic polymer solar cell, etc., in accordance with structural materials.

A solar cell module includes a plurality of photoelectric conversion cells. A lower electrode layer, a semiconductor layer and an upper electrode layer are formed on a transparent substrate, and a portion of each layer is removed to form the photoelectric conversion cells. The lower electrode layer, the semiconductor layer and the upper electrode layer are formed in an area having the photoelectric conversion cells as well as an area not having the photoelectric conversion cells.

When the lower electrode layer, the semiconductor layer and the upper electrode layer are formed on the entire surface of the substrate, the lower electrode layer and the upper electrode layer may be electrically connected to each other at an edge portion of the substrate. When the lower electrode layer and the upper electrode layer are electrically connected to each other, the light energy conversion efficiency of the solar cell may be reduced. Accordingly, a process is needed in which a deposited material is removed at an edge portion of the substrate to electrically separate the lower electrode layer from the upper electrode layer.

SUMMARY

Example embodiments of the present invention provide a solar cell module capable of improving light energy efficiency so that a lower electrode and an upper electrode of photoelectric conversion cells are prevented from being electrically connected to each other.

Example embodiments of the present invention also provide a method of manufacturing the solar cell module.

According to one embodiment of the present invention, a solar cell module includes a substrate, a lower electrode layer, a semiconductor layer and an upper electrode layer. The lower electrode layer includes a plurality of area-separating grooves formed thereon, which separates the substrate into an active area and a peripheral area surrounding the active area, and a plurality of first cell-separating grooves formed in the active area. The semiconductor layer is formed on the lower electrode layer. The semiconductor layer includes a plurality of second cell-separating grooves formed thereon, which are spaced apart from the first cell-separating grooves. The upper electrode layer is formed on the semiconductor layer. The upper electrode layer includes a plurality of third cell-separating grooves formed thereon, which are spaced apart from the second separating grooves.

In an example embodiment of the present invention, the solar cell module may further include a plurality of first dummy cells formed in the peripheral area to be spaced apart from the area-separating grooves, and each of the first dummy cells has the lower electrode layer, the semiconductor layer and the upper electrode layer.

In an example embodiment of the present invention, the solar cell module may further include a plurality of second dummy cells formed in the peripheral area that are spaced apart from the first dummy cells, the second dummy cells having the lower electrode layer.

In an example embodiment of the present invention, the solar cell module may further include a plurality of second dummy cells formed in the peripheral area to be spaced apart from the first dummy cells, and each of the second dummy cells has the lower electrode layer, the semiconductor layer and the upper electrode layer.

In an example embodiment of the present invention, the lower electrode layer of the second dummy cells may contact with an end portion of the area-separating grooves, and the semiconductor layer and the upper electrode layer of the second dummy cells may be spaced apart from the semiconductor layer and the upper electrode layer that are deposited in the active area.

According to another embodiment of the present invention, a solar cell module includes a substrate, a lower electrode layer, a semiconductor layer and an upper electrode layer. The lower electrode layer includes a plurality of area-separating grooves formed thereon, which separates the substrate into an active area and a peripheral area surrounding the active area, a plurality of first cell-separating grooves formed in the active area, and a plurality of first peripheral grooves formed in the peripheral area. The semiconductor layer has a plurality of second cell-separating grooves formed thereon, which are spaced apart from the first cell-separating grooves, and a plurality of second peripheral grooves formed on the peripheral area to be connected to the first peripheral grooves. The upper electrode layer has a plurality of third cell-separating grooves formed thereon, which are spaced apart from the second separating grooves, and a plurality of third peripheral grooves formed on the peripheral area to be connected to the second peripheral grooves.

In an example embodiment of the present invention, the solar cell module may further include a plurality of first dummy cells formed in the peripheral area to be spaced apart from the first to third peripheral grooves, and each of the first dummy cells has the lower electrode layer, the semiconductor layer and the upper electrode layer.

In an example embodiment of the present invention, the solar cell module may further include a plurality of second dummy cells disposed in the peripheral area to face the first dummy cells by interposing the first to third peripheral grooves, and the second dummy cells have the lower electrode layer.

In an example embodiment of the present invention, the solar cell module may further include a plurality of second dummy cells disposed in the peripheral area to face the first dummy cells by interposing the first to third peripheral grooves, and the second dummy cells have the lower electrode layer, the semiconductor layer and the upper electrode layer.

In an example embodiment of the present invention, the semiconductor layer may further include a plurality of fourth peripheral grooves formed thereon, which are spaced apart from the second peripheral grooves in the peripheral area. The upper electrode layer may further include a plurality of fifth peripheral grooves formed in the peripheral area to be connected to the fourth peripheral grooves.

According to still another embodiment of the present invention, in a method of manufacturing a solar cell module, a lower electrode layer is formed on a substrate. The lower electrode layer has a plurality of area-separating grooves formed thereon and a plurality of first cell-separating grooves formed thereon. A semiconductor layer is formed on the lower electrode layer. The semiconductor layer has a plurality of second cell-separating grooves spaced apart from the first cell-separating grooves. An upper electrode layer is formed on the semiconductor layer. The upper electrode layer has a plurality of third cell-separating grooves spaced apart from the second separating grooves.

In an example embodiment of the present invention, forming the lower electrode layer may include forming the lower electrode layer on the substrate, and forming the area-separating grooves and the first cell-separating grooves by irradiating a first laser beam onto the substrate on which the lower electrode layer is formed. The area-separating grooves may separate the substrate into an active area and a peripheral area surrounding the active area.

In an example embodiment of the present invention, forming the semiconductor layer may include forming the semiconductor layer on the lower electrode layer having the first cell-separating grooves formed thereon, and forming the second cell-separating grooves exposing the lower electrode layer by irradiating a second laser beam onto a different area that is different from an area where the first cell-separating grooves are formed on the semiconductor layer formed in the active area.

In an example embodiment of the present invention, forming an upper electrode layer may include forming the upper electrode layer on the semiconductor layer having the second cell-separating grooves formed thereon, and forming the third cell-separating grooves exposing the lower electrode layer by irradiating a third laser beam onto a different area that is different from an area where the second cell-separating grooves are formed on the upper electrode layer formed in the active area.

In an example embodiment of the present invention, forming a plurality of first dummy cells may further include the first dummy cells being spaced apart from the area-separating grooves in the peripheral area. The first dummy cells may include the lower electrode layer, the semiconductor layer and the upper electrode layer.

In an example embodiment of the present invention, forming the first dummy cells may include forming first peripheral separating grooves in the peripheral area by irradiating a fourth laser beam onto the peripheral area to remove a portion of the lower electrode layer, a portion of the semiconductor layer and a portion of the upper electrode layer that are formed in the peripheral area. The first dummy cells may be spaced apart from the area-separating grooves by the first peripheral grooves.

In an example embodiment of the present invention, forming a plurality of second dummy cells may further include the second dummy cells being spaced apart from the first dummy cells in the peripheral area, and the second dummy cells may include the lower electrode layer.

In an example embodiment of the present invention, forming the second dummy cells may include forming second peripheral separating grooves in the peripheral area by irradiating a fifth laser beam onto the peripheral area to remove the upper electrode layer and the semiconductor layer formed in the peripheral area. The second dummy cells may be formed by the second peripheral separating grooves.

In an example embodiment of the present invention, forming a plurality of second dummy cells may further include the second dummy cells being spaced apart from the first dummy cells in the peripheral area, the second dummy cells having the lower electrode layer, the semiconductor layer and the upper electrode layer.

In an example embodiment of the present invention, forming the second dummy cells may include forming second peripheral separating grooves by irradiating a fifth laser beam onto the peripheral area to remove a portion of the upper electrode layer and a portion of the semiconductor layer that are formed in the peripheral area. The semiconductor layer and the upper electrode layer of the second dummy cells may be electrically isolated from the semiconductor layer and the upper electrode layer of photoelectric conversion cell formed in a peripheral area of the active area by the second peripheral separating grooves.

In an example embodiment of the present invention, the method of manufacturing the solar cell may further include removing the lower electrode layer, the semiconductor layer and the upper electrode layer formed in the peripheral area by irradiating a fourth laser beam onto the peripheral area spaced apart from the area-separating grooves.

According to one or more embodiments of a solar cell module and a method of manufacturing the solar cell module, a peripheral separating groove which separates an active area from a peripheral area are spaced apart from area-separating grooves, so that a leakage current generated in the peripheral area may be prevented from being transmitted to the active area. Therefore, a leakage current generated in the peripheral area may affect photoelectric conversion cells formed in the active area, so that the light energy conversion efficiency of the solar cell may be prevented from being reduced.

BRIEF DESCRIPTION OF THE DRAWINGS

The above and other features and advantages of the present disclosure will become more apparent by describing in detail example embodiments thereof with reference to the accompanying drawings, in which.

DETAILED DESCRIPTION

Figure 1:
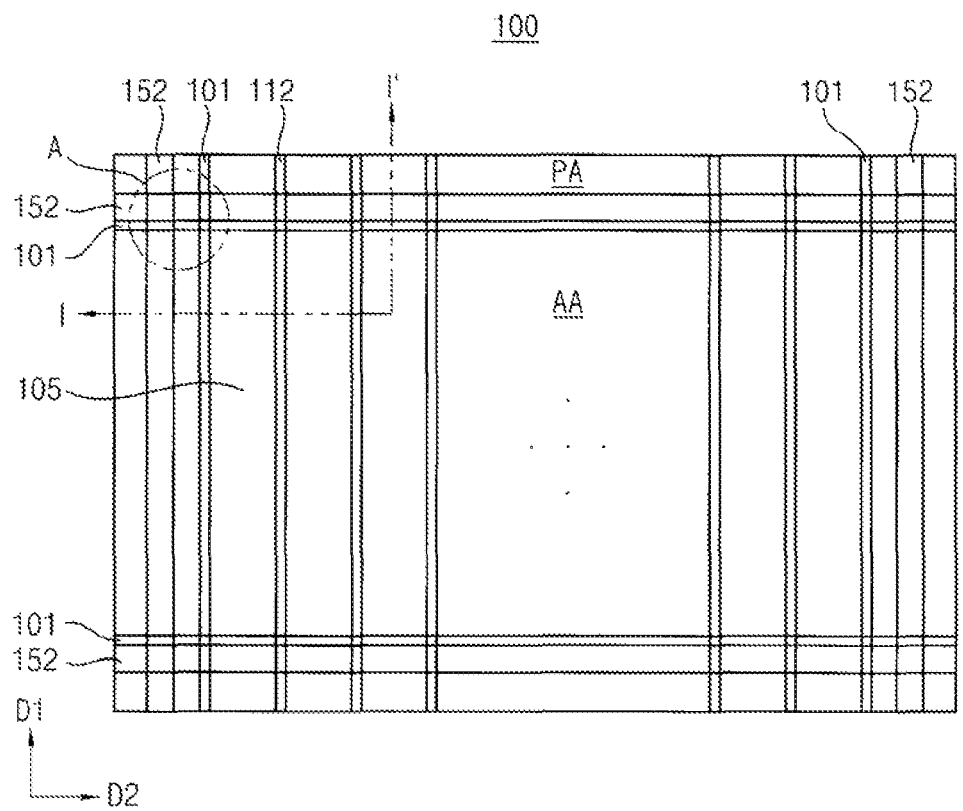
FIG. 1 is a plan view illustrating a solar cell module according to an example embodiment of the present invention.

The present disclosure is described more fully hereinafter with reference to the accompanying drawings, in which example embodiments of the present invention are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2:
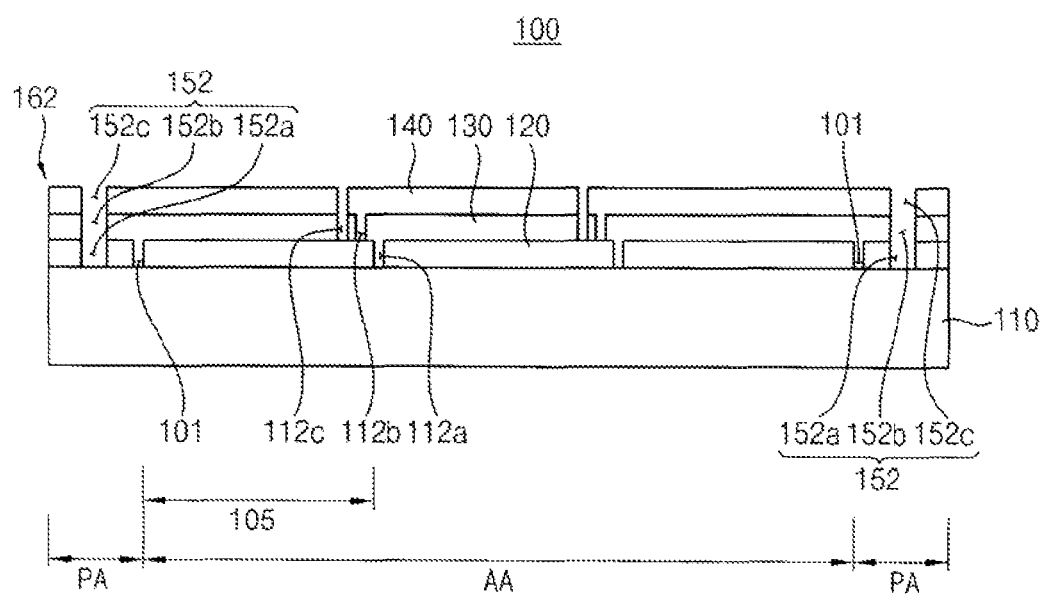
FIG. 2 is a cross-sectional view taken along a line I-I in FIG. 1 according to an embodiment.

FIG. 1 is a plan view illustrating a solar cell module 100 according to an example embodiment of the present invention. FIG. 2 is a cross-sectional view taken along a line IT in FIG. 1 according to an embodiment.

Referring to FIGS. 1 and 2, a solar cell module 100 according to the present example embodiment includes a transparent substrate 110, a plurality of photoelectric conversion cells 105 and a plurality of first dummy cells 162.

The transparent substrate 110 includes an active area AA having the photoelectric conversion cells 105 and a peripheral area PA surrounding the active area AA. The active area AA and the peripheral area PA may be divided by a plurality of area-separating grooves 101. In the present example embodiment, the transparent substrate 110 may be a glass substrate.

The photoelectric conversion cells 105 are formed in the active area AA. The photoelectric conversion cells 105 may be extended in a first direction D1, and serially coupled to each other along a second direction D2 crossing the first direction D1. In the present example embodiment, the first direction D1 may be perpendicular to the second direction D2. All of the photoelectric conversion cells 105 may have the same area. For example, the photoelectric conversion cells 105 may have a line width of about 1 cm and a length of about 1 m. That is, the photoelectric conversion cells 105 may have a long bar shape.

The photoelectric conversion cells 105 include a lower electrode layer 120, a semiconductor layer 130 and an upper electrode layer 140 that are disposed on the transparent substrate 110.

The lower electrode layer 120 is formed on the transparent substrate 110. The lower electrode layer 120 may include a material having light-transmitting properties and electrically conductive properties. The lower electrode layer 120 may include a transparent conductive oxide (TCO). For example, the lower electrode layer 120 may include indium tin oxide (ITO), tin oxide ($SnO_2$), etc. The lower electrode layer 120 may have a thickness of about 600 Å to 2 µm.

The semiconductor layer 130 generates an electromotive force in response to light transmitted through the transparent substrate 110 and the lower electrode layer 120. An electric-field may be formed between the lower electrode layer 120 and the upper electrode layer 140 due to the electromotive force, so that an electric current may be generated. For example, the semiconductor layer 130 may be formed by sequentially depositing a p-type silicon film, and i-type silicon film and an n-type silicon film. In this case, the semiconductor layer 130 may have a thickness of about 2,000 Å to 4,000 Å. Alternatively, the semiconductor layer 130 may be formed by depositing a p-type silicon film/an i-type silicon film/an n-type silicon film in a double-layer structure. In this case, the semiconductor layer 130 may have a thickness of about 1.5 µm to 2.5 µm.

The upper electrode layer 140 is disposed on the semiconductor layer 130. The upper electrode layer 140 may include a metal. For example, the upper electrode layer 140 may be formed of indium tin oxide (ITO), tin oxide ($SnO_2$), etc. The upper electrode layer 140 may perform the function of a reflective electrode. The upper electrode layer 140 may have a thickness of about 2,000 Å to 4,000 Å.

The photoelectric conversion cells 105 are divided by a cell-separating groove 112. The cell-separating groove 112 includes a plurality of first cell-separating grooves 112a, a plurality of second-separating grooves 112b and a plurality of third cell-separating grooves 112c. The first cell-separating grooves 112a are formed on the lower electrode layer 120. The second-separating grooves 112b are formed on the semiconductor layer 130 that are spaced apart from the first cell-separating grooves 112a. The third cell-separating grooves 112c are formed on the upper electrode layer 140 that are spaced apart from the second cell-separating grooves 112b. The third cell-separating grooves 112c expose a portion of the lower electrode layer 120.

The upper electrode layer 140 of each of the photoelectric conversion cells 105 may be electrically connected to the lower electrode layer 120 of an adjacent photoelectric conversion cell 105 through the second cell-separating groove 112b.

The first dummy cells 162 are formed in the peripheral area PA to be spaced apart from the photoelectric conversion cells 105. For example, the first dummy cells 162 contact with an edge portion of the transparent substrate 110 in the peripheral area PA. The first dummy cells 162 are spaced apart from the photoelectric conversion cells 105. The photoelectric conversion cells 105 and the first dummy cells 162 are electrically and physically separated from each other by a plurality of first peripheral separating grooves 152 formed in the peripheral area PA.

The first dummy cells 162 may include the lower electrode layer 120, the semiconductor layer 130 and the upper electrode layer 140.

The first peripheral separating grooves 152 may be defined by a first peripheral groove 152a, a second peripheral groove 152b and a third peripheral groove 152c. The first peripheral groove 152a is formed in the peripheral area PA of the lower electrode layer 120. The second peripheral groove 152b is connected to the first peripheral groove 152a in the peripheral area PA. The third peripheral groove 152c is connected to the second peripheral groove 152b in the peripheral area PA of the upper electrode layer 140.

The area-separating grooves 101, the first to third cell-separating grooves 112a, 112b and 112c, and the first peripheral separating grooves 152 may be formed by using a laser scribing process in which a portion or all of the layers deposited on the transparent substrate 110 may be removed by using a laser beam.

Figure 3:
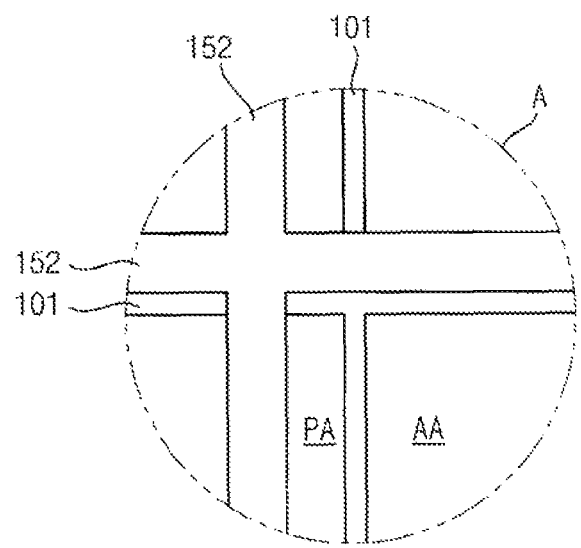
FIG. 3 is an enlarged plan view illustrating a portion "A" of FIG. 1 according to an embodiment.

FIG. 3 is an enlarged plan view illustrating a portion "A" of FIG. 1 according to an embodiment.

Referring to FIG. 3, the first peripheral separating groove 152 is formed in the peripheral area PA of a transparent substrate. The first peripheral separating groove 152 may be spaced apart from the first area-separating groove 101 in parallel with the first area-separating groove 101 by a predetermined distance.

Alternatively, the width of the first peripheral separating groove 152 may be different from the width of the first area-separating groove 101. For example, the width of the first peripheral separating groove 152 may be substantially larger than that of the first area-separating groove 101.

Figure 4A:
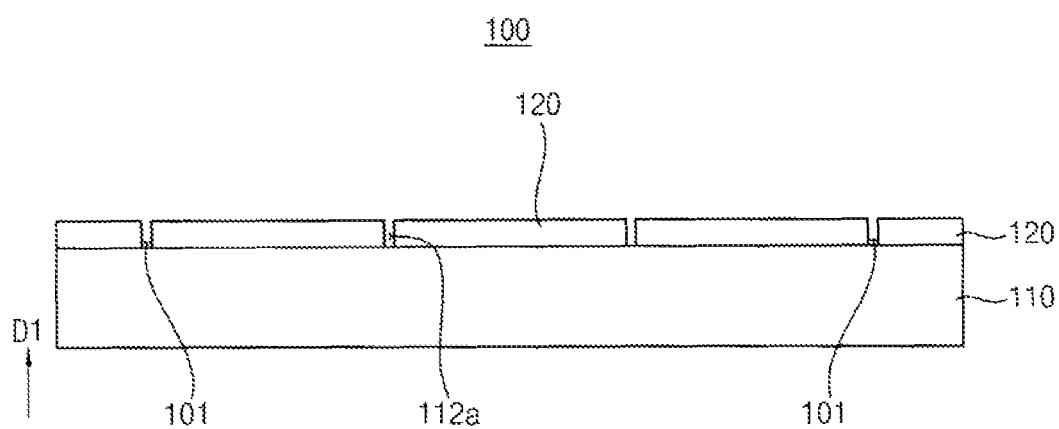
FIGS. 4A to 4C are cross-sectional views illustrating a process for manufacturing the solar cell module of FIG. 2 according to one or more embodiments.
Figure 4B:
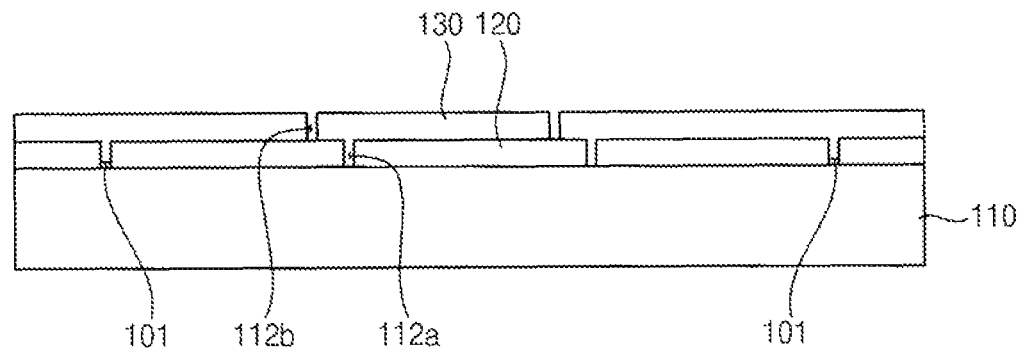
Figure 4C:
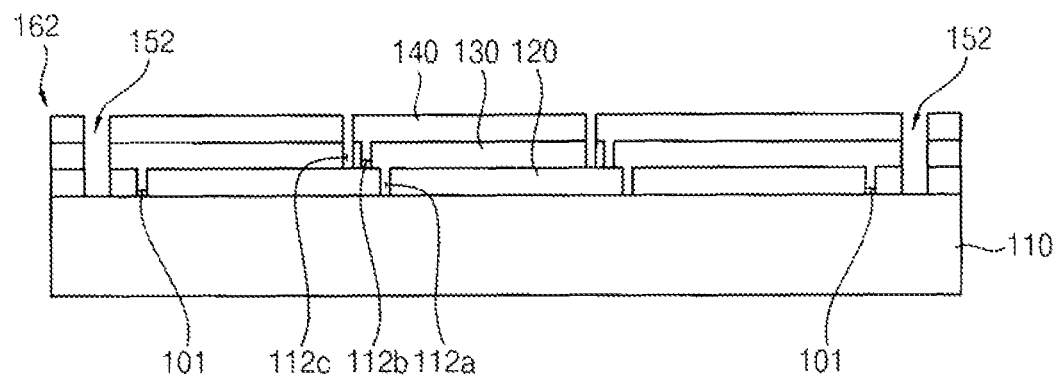

FIGS. 4A to 4C are cross-sectional views illustrating a process for manufacturing the solar cell module of FIG. 2 according to one or more embodiments.

Referring to FIGS. 2 and 4A, the lower electrode layer 120 is formed on the transparent substrate 110.

A first laser beam may be irradiated onto the transparent substrate 110 having the lower electrode layer 120 to form the area-separating grooves 101 and the first cell-separating grooves 112a so that the area-separating grooves 101 separate an area of the transparent substrate 110 into the active area AA and the peripheral area PA surrounding the active area AA. The first cell-separating grooves 112a are formed through the lower electrode layer 120 in the active area AA. The area-separating grooves 101 may be simultaneously formed with the first cell-separating groove 112a. Here, the first laser beam may have a wavelength of about 1,064 nm. The first laser beam may be irradiated in a first direction D1. Here, the first direction D1 may be a direction from the lower surface of the transparent substrate 110 to the upper surface of the transparent substrate 110 where the lower electrode layer 120 is formed.

Referring to FIGS. 2 and 4B, the semiconductor layer 130 is deposited on the transparent substrate 110 having the lower electrode layer 120. The semiconductor layer 130 may be formed by depositing a p-type silicon film/an i-type silicon film/an n-type silicon film in a single-layer structure. Alternatively, the semiconductor layer 130 may be formed by depositing a p-type silicon film/an i-type silicon film/an n-type silicon film in a double-layer structure.

Then, the second cell-separating grooves 112b spaced apart from the first cell-separating groove 112a are formed on the semiconductor layer 130 formed in the active area AA. For example, the second cell-separating grooves 112b may be formed by irradiating a second laser beam onto another area that is different from an area where the first cell-separating grooves 112a are formed on the semiconductor layer 130 formed in the active area AA. The second cell-separating grooves 112b expose the lower electrode layer 120. The second laser beam may have a wavelength of about 532 nm. In this case, the second laser beam is irradiated onto a position spaced apart from the first cell-separating grooves 112a by a predetermined distance to not overlap with the first cell-separating grooves 112a formed on the lower electrode layer 120.

Referring to FIGS. 2 and 4C, the upper electrode layer 140 is formed on the transparent substrate 110 on which the semiconductor layer 130 is formed.

Then, the third cell-separating grooves 112c spaced apart from the second cell-separating groove 112b are formed on the upper electrode layer 140 formed in the active area AA. For example, the third cell-separating grooves 112c may be formed by irradiating a third laser beam onto another area that is different from an area where the second cell-separating grooves 112b are formed on the upper electrode layer 140 formed in the active area AA. The third cell-separating grooves 112c expose the lower electrode layer 120. The third laser beam may have a wavelength of about 532 nm.

Finally, a portion of the lower electrode layer 120, a portion of the semiconductor layer 130 and a portion of the upper electrode layer 140 that are formed in the peripheral area PA spaced apart from the active area AA are removed to form the first peripheral separating grooves 152. For example, the first peripheral separating grooves 152 may be formed in the peripheral area PA spaced apart from the area-separating grooves 101 by irradiating a fourth laser beam thereto. The fourth laser beam may have a wavelength of about 1,064 nm.

According to the present example embodiment, the first peripheral separating grooves 152 which electrically and physically separate the active area AA and the peripheral area PA are formed through one layer process, so that a manufacturing process of a solar cell module may be simplified. In addition, the first peripheral separating grooves 152 are formed in an area spaced apart from the active area AA, so that a leakage current may be prevented from being transmitted to the active area even if a leakage current is generated in the peripheral area PA.

Figure 5:
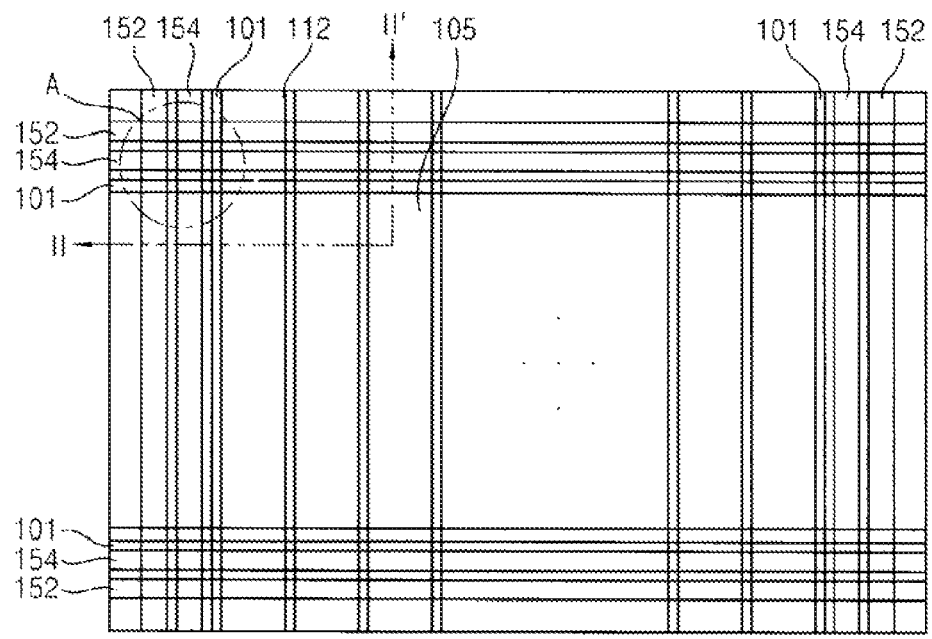
FIG. 5 is a plan view illustrating a solar cell module according to another example embodiment of the present invention.
Figure 6:
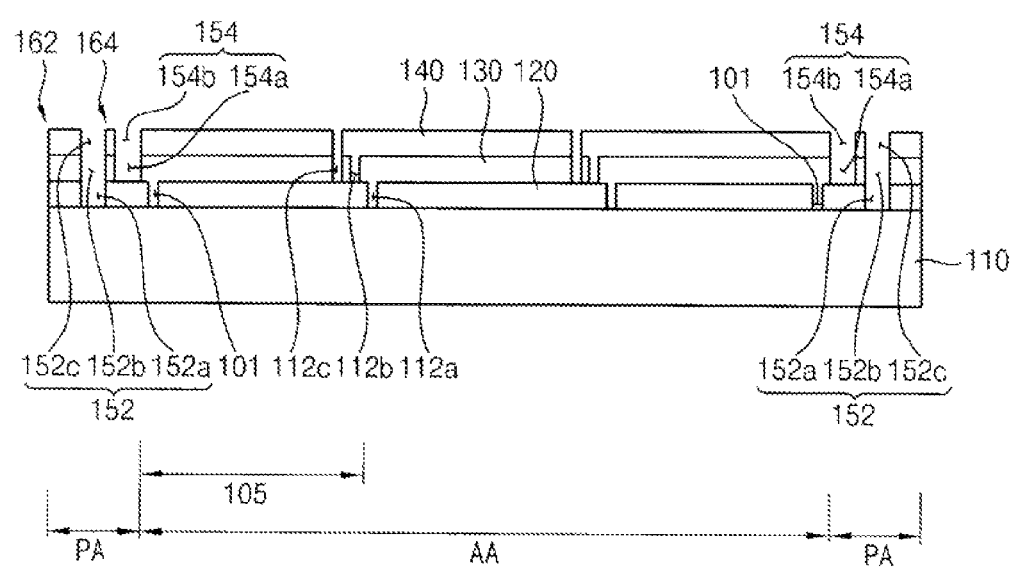
FIG. 6 is a cross-sectional view taken along a line II-II' in FIG. 5 according to an embodiment.

FIG. 5 is a plan view illustrating a solar cell module 200 according to another example embodiment of the present invention. FIG. 6 is a cross-sectional view taken along a line II-II' in FIG. 5.

Referring to FIGS. 5 and 6, the solar cell module 200 according to the present example embodiment includes a transparent substrate 110, a plurality of photoelectric conversion cells 105, a plurality of first peripheral separating grooves 152, a plurality of second peripheral separating grooves 154, a plurality of first dummy cells 162 and a plurality of second dummy cells 164.

The solar cell module 200 according to the present example embodiment is substantially the same as the solar cell module 100 described according to one or more embodiments in FIGS. 1 and 3 except that the second dummy cells 164 formed by a plurality of second peripheral grooves 154a to 154b are included in the solar cell module 200, and the area-separating grooves 101, the first peripheral separating grooves 152 and the second peripheral separating grooves 154 are spaced apart from each other. Thus, the same reference numerals will be used to refer to the same elements or like parts as those described in the embodiments of FIGS. 1 and 3, and any further explanation concerning the above elements will be omitted.

The transparent substrate 110 may include an active area AA where the photoelectric conversion cells 105 are formed thereon and a peripheral area PA where the first and second dummy cells 162 and 164 are formed thereon. The active area AA and the peripheral area PA may be divided by the area-separating grooves 101.

The first peripheral separating grooves 152 are spaced apart from the area-separating grooves 101 in the peripheral area PA. The first peripheral separating grooves 152 expose a portion of the transparent substrate 110. The first peripheral separating grooves 152 may be defined by the first peripheral groove 152a formed in the peripheral area PA of the lower electrode layer 120, the second peripheral groove 152b connected to the first peripheral groove 152a in the peripheral area PA, and the third peripheral groove 152c connected to the second peripheral groove 152b in the peripheral area PA of the upper electrode layer 140.

The second peripheral separating grooves 154 are formed in the peripheral area PA. The second peripheral separating grooves 154 may be formed on an area that is different from an area where the first peripheral separating grooves 152 are formed thereon. The second peripheral separating grooves 154 expose a portion of the lower electrode layer 120 of the second dummy cells 164. The second peripheral separating grooves 154 may be positioned between the first peripheral separating grooves 152 and the area-separating grooves 101.

The second peripheral separating grooves 154 may be defined by a fourth peripheral groove 154a formed in the peripheral area PA of the semiconductor layer 130 and a fifth peripheral groove 154b connected to the fourth peripheral groove 154a in the peripheral area PA of the upper electrode layer 140.

The first dummy cells 162 are formed in the peripheral area PA. The first dummy cells 162 include the lower electrode layer 120, the semiconductor layer 130 and the upper electrode layer 140.

The second dummy cells 164 are spaced apart from the first dummy cells 162 by a predetermined distance in the peripheral area PA. The second dummy cells 164 may be formed in an area where a first side thereof contacts the second peripheral separating grooves 154, and a second side thereof contacts the first peripheral separating groove 152. The second dummy cells 164 include the lower electrode layer 120, the semiconductor layer 130 and the upper electrode layer 140. The lower electrode layer 120 of the second dummy cells 164 is exposed through the second peripheral separating grooves 154.

The active area AA and the peripheral area PA are electrically and physically separated from each other through the first and second peripheral separating grooves 152 and 154.

The first dummy cells 162 and the second dummy cells 164 are electrically and physically separated from each other through the first peripheral separating grooves 152.

Figure 7:
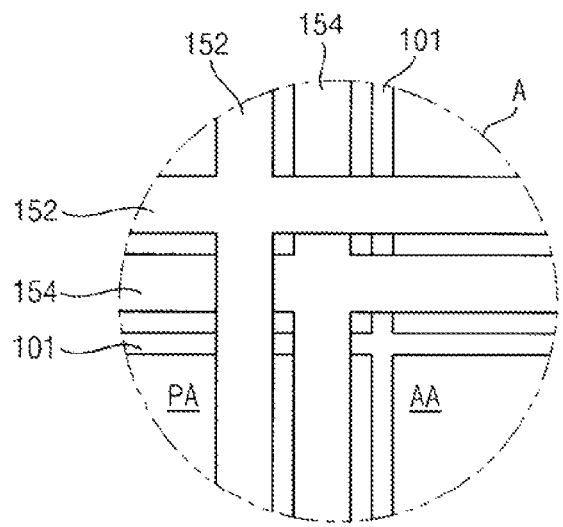
FIG. 7 is an enlarged plan view illustrating a portion "A" of FIG. 5 according to an embodiment.

FIG. 7 is an enlarged plan view illustrating a portion "A" of FIG. 5 according to an embodiment.

Referring to FIGS. 5 and 7, the first peripheral separating grooves 152 and the second peripheral separating grooves 154 are formed in the peripheral area PA of the transparent substrate 110. The second peripheral separating grooves 154 may be spaced apart from the area-separating grooves 101 by a predetermined distance in parallel with the area-separating grooves 101. The first peripheral separating grooves 152 are spaced apart from the second peripheral separating grooves 154 by a predetermined distance.

A method of manufacturing the solar cell module 200 according to the present example embodiment is substantially the same as the method of manufacturing the solar cell module 100 described according to one or more embodiments in FIGS. 4A to 4C except for further including a process of forming the second peripheral separating grooves 154. Thus, the same reference numerals will be used to refer to the same elements or like parts as those described in the embodiments of FIGS. 4A to 4C and any further explanation concerning the above elements will be omitted.

The lower electrode layer 120, the semiconductor layer 130 and the upper electrode layer 140 are formed on the transparent substrate 110, and the first to third cell-separating grooves 112a to 112c formed in the active area AA may be formed through a laser process. Then, the first peripheral separating grooves 152 exposing a portion of the transparent substrate 110 may be formed by irradiating a fourth laser beam onto the peripheral area PA. The fourth laser beam may have a wavelength of about 1,064 nm.

Then, a fifth laser beam may be irradiated onto an area that is different from an area where the first peripheral separating grooves 152 are formed in the peripheral area PA to form the second peripheral separating grooves 154 exposing a portion of the lower electrode layer 120 formed in the peripheral area PA. The fifth laser beam may have a wavelength of about 532 nm.

According to the present example embodiment, the first peripheral separating grooves 152 and the second peripheral separating grooves 154 which electrically and physically separate the active area AA and the peripheral area PA are formed in an area spaced apart from the active area AA, so that a leakage current may be prevented from being transmitted to the active area even if a leakage current is generated in the peripheral area PA.

Figure 8:
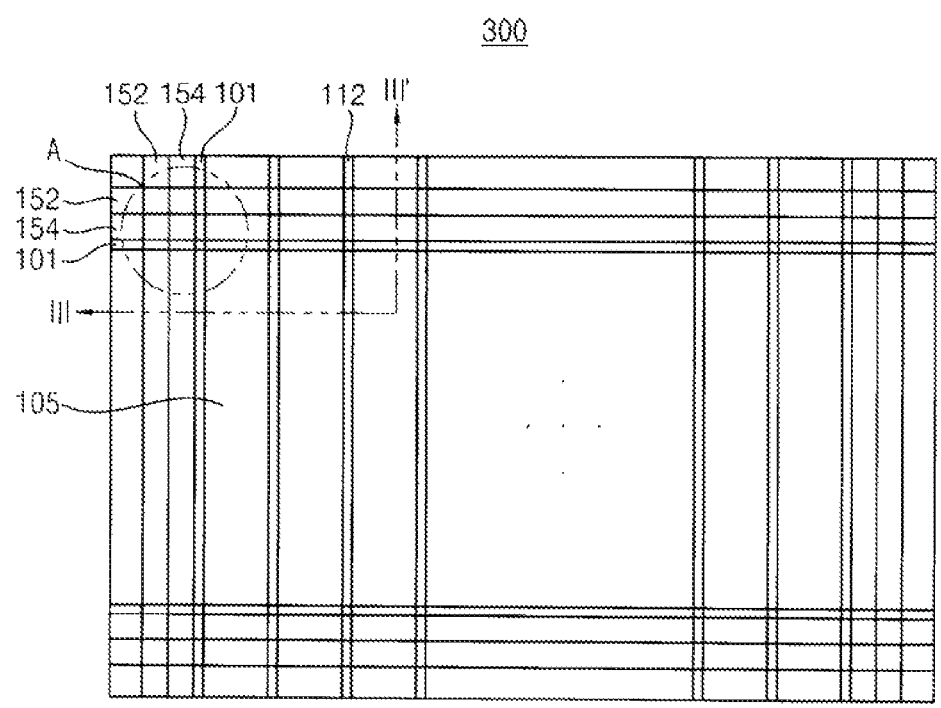
FIG. 8 is a plan view illustrating a solar cell module according to still another example embodiment of the present invention.
Figure 9:
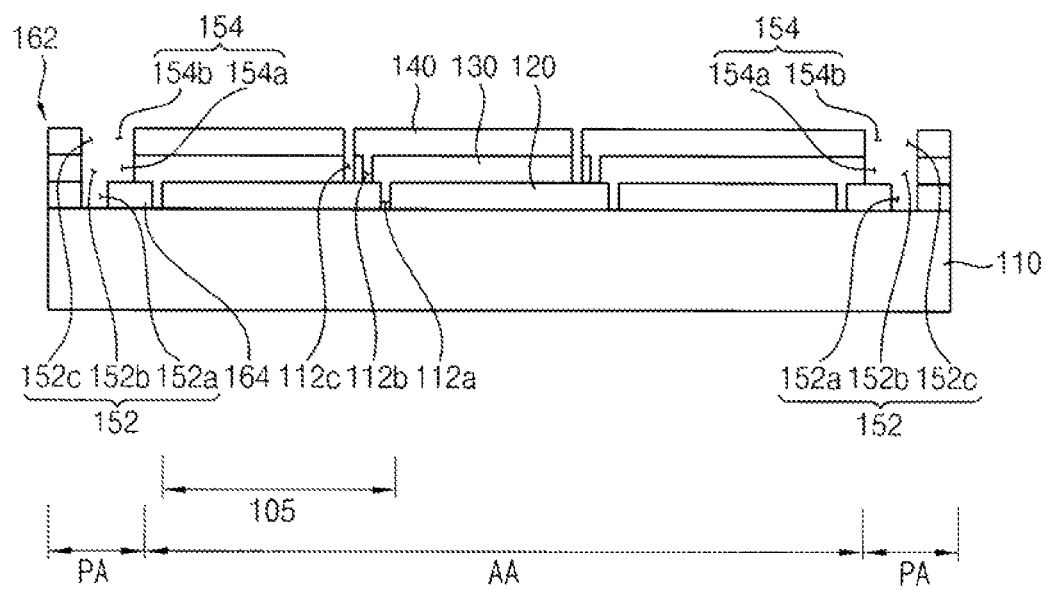
FIG. 9 is a cross-sectional view taken along a line III-III' in FIG. 8 according to an embodiment.

FIG. 8 is a plan view illustrating a solar cell module 300 according to still another example embodiment of the present invention. FIG. 9 is a cross-sectional view taken along a line III-III' in FIG. 8 according to an embodiment.

Referring to FIGS. 8 and 9, the solar cell module 300 according to the present example embodiment includes a transparent substrate 110, a plurality of photoelectric conversion cells 105, a plurality of first peripheral separating grooves 152, a plurality of second peripheral separating grooves 154, a plurality of first dummy cells 162 and a plurality of second dummy cells 164.

The solar cell module 300 according to the present example embodiment is substantially the same as the solar cell module 100 described according to one or more embodiments in FIGS. 1 and 3 except that the second dummy cells 164 and the second peripheral separating grooves 154 are included in the solar cell module 300, and a terminal of the first peripheral separating grooves 152 and a terminal of the second peripheral separating grooves 154 are contacted with each other. Thus, the same reference numerals will be used to refer to the same elements or like parts as those described in the embodiments of FIGS. 1 and 3, and any further explanation concerning the above elements will be omitted.

The transparent substrate 110 may include an active area AA where the photoelectric conversion cells 105 are formed thereon and a peripheral area PA where the first and second dummy cells 162 and 164 are formed thereon. The active area AA and the peripheral area PA may be divided by the area-separating grooves 101.

The first peripheral separating grooves 152 are spaced apart from the area-separating grooves 101 in the peripheral area PA. The first peripheral separating grooves 152 expose a portion of the transparent substrate 110. The first peripheral separating grooves 152 may be defined by the first peripheral groove 152a formed in the peripheral area PA of the lower electrode layer 120, the second peripheral groove 152b connected to the first peripheral groove 152a in the peripheral area PA, and the third peripheral groove 152c connected to the second peripheral groove 152b in the peripheral area PA of the upper electrode layer 140.

The first dummy cells 162 include the lower electrode layer 120, the semiconductor layer 130 and the upper electrode layer 140.

The second peripheral separating grooves 154 are formed to contact with the first peripheral separating grooves 152 in the peripheral area PA. The second peripheral separating grooves 154 may be defined by a fourth peripheral groove 154a formed in the peripheral area PA of the semiconductor layer 130 and a fifth peripheral groove 154b connected to the fourth peripheral groove 154a in the peripheral area PA of the upper electrode layer 140.

The second dummy cells 164 include the lower electrode layer 120. A portion of the lower electrode layer 120 of the second dummy cells 164 is exposed by the second peripheral separating grooves 154.

Figure 10:
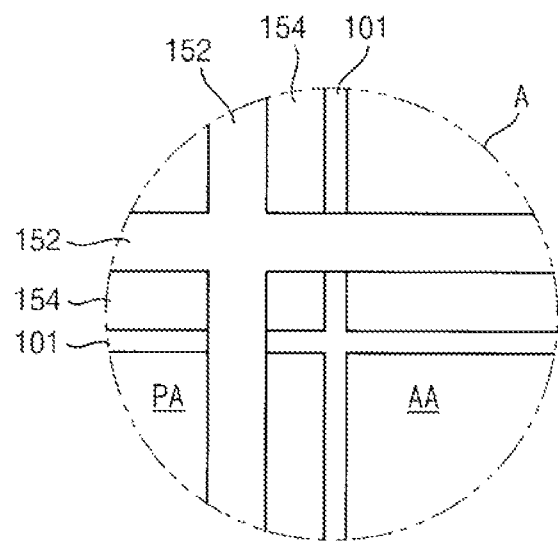
FIG. 10 is an enlarged plan view illustrating a portion "A" of FIG. 8 according to an embodiment.

FIG. 10 is an enlarged plan view illustrating a portion "A" of FIG. 8 according to an embodiment.

Referring to FIG. 10, the first peripheral separating grooves 152 and the second peripheral separating grooves 154 are formed in the peripheral area PA of the transparent substrate 110. A portion of the second peripheral separating grooves 154 may be formed to contact with a portion of the area-separating grooves 101. The first peripheral separating grooves 152 may be formed to contact with a portion of the second peripheral separating grooves 154.

A method of manufacturing the solar cell module 300 of the present example embodiment is substantially the same as the method of manufacturing the solar cell module 100 described according to one or more embodiments in FIGS. 4A to 4C except for further including a process of forming the second peripheral separating grooves 154. Thus, the same reference numerals will be used to refer to the same elements or like parts as those described in the embodiments of FIGS. 4A to 4C and any further explanation concerning the above elements will be omitted.

The lower electrode layer 120, the semiconductor layer 130 and the upper electrode layer 140 are formed on the transparent substrate 110, and the first to third cell-separating grooves 112a to 112c formed in the active area AA may be formed through a laser process. Then, the first peripheral separating grooves 152 exposing a portion of the transparent substrate 110 may be formed by irradiating a fourth laser beam onto the peripheral area PA. The fourth laser beam may have a wavelength of about 1,064 nm.

Then, a fifth laser beam may be irradiated onto an area that is different from an area wherein the first peripheral separating grooves 152 are formed in the peripheral area PA to form the second peripheral separating grooves 154 exposing a portion of the lower electrode layer 120 formed in the peripheral area PA. The fifth laser beam may have a wavelength of about 532 nm.

According to the present example embodiment, the first peripheral separating grooves 152 and the second peripheral separating grooves 154 are formed to contact with an end portion of the area-separating grooves 101 contacting with the peripheral area PA, and not with another end portion of the area-separating grooves 101 contacting with the active area AA, so that a leakage current may be prevented from being transmitted to the active area even if a leakage current is generated in the peripheral area PA.

Figure 11:
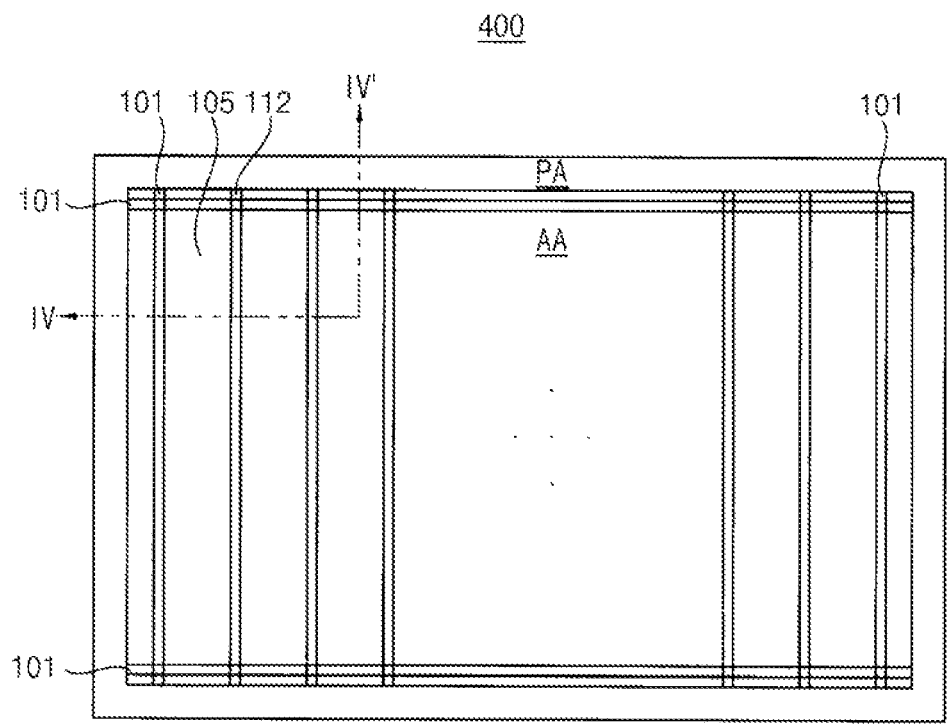
FIG. 11 is a plan view illustrating a solar cell module according to still another example embodiment of the present invention.
Figure 12:
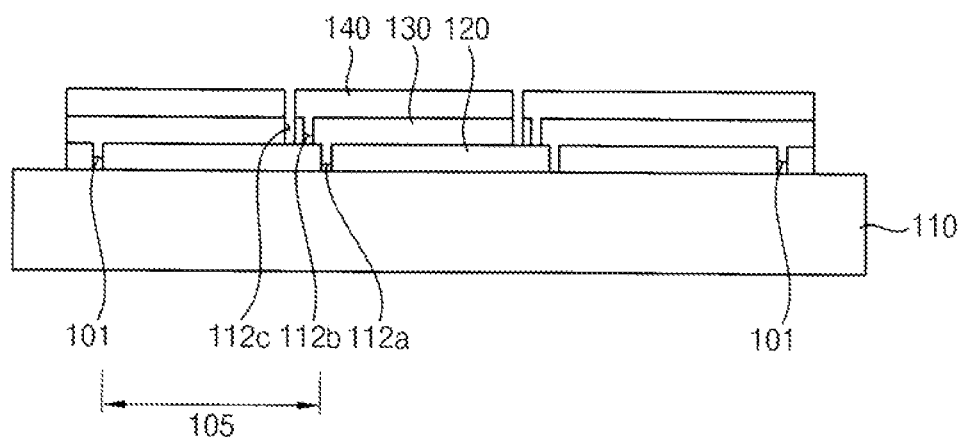
FIG. 12 is a cross-sectional view taken along a line IV-V' in FIG. 11 according to an embodiment.

FIG. 11 is a plan view illustrating a solar cell module 400 according to still another embodiment of the present invention. FIG. 12 is a cross-sectional view taken along a line IV-V' in FIG. 11 according to an embodiment.

The solar cell module 400 according to the present example embodiment is substantially the same as the solar cell module 100 described according to one or more embodiments in FIGS. 1 and 3 except that the lower electrode layer 120, the semiconductor layer 130 and the upper electrode layer 140 that are formed in the peripheral area are removed. Thus, the same reference numerals will be used to refer to the same elements or like parts as those described in the embodiments of FIGS. 1 and 3 and any further explanation concerning the above elements will be omitted.

Referring to FIGS. 11 and 12, a solar cell module 400 according to the present embodiment includes a transparent substrate 110 and a plurality of photoelectric conversion cells 105.

The transparent substrate 110 may include the active area AA where the photoelectric conversion cells 105 are formed thereon and the peripheral area PA surrounding the active area AA. The active area AA and the peripheral area PA may be divided by the area-separating grooves 101.

The lower electrode layer 120, the semiconductor layer 130 and the upper electrode layer 140 may be sequentially deposited in the active area AA to form the photoelectric conversion cells 105. The photoelectric conversion cells 105 are divided by the cell-separating groove 112. The cell-separating groove 112 includes a plurality of first cell-separating grooves 112a, a plurality of second-separating grooves 112b, and a plurality of third cell-separating grooves 112c. The first cell-separating grooves 112a are formed on the lower electrode layer 120. The second-separating grooves 112b are formed on the semiconductor layer 130 that are spaced apart from the first cell-separating grooves 112a. The third cell-separating grooves 112c are formed on the upper electrode layer 140 that are spaced apart from the second cell-separating grooves 112b. The third cell-separating grooves 112c expose a portion of the lower electrode layer 120. The upper electrode layer 140 of each of the photoelectric conversion cells 105 may be electrically connected to the lower electrode layer 120 of an adjacent photoelectric conversion cell 105 through the second cell-separating groove 112b.

All of the lower electrode layer 120, the semiconductor layer 130 and the upper electrode layer 140 formed on the peripheral area PA may be removed through a laser trimming process.

A method of manufacturing a solar cell module according to the present example embodiment includes a process of forming a lower electrode layer 120 having the area-separating grooves 101 and the first cell-separating grooves 112a on the transparent substrate 110, a process of forming a semiconductor layer having the second cell-separating grooves 112b on the lower electrode layer 120, a process of forming an upper electrode layer 140 having the third cell-separating grooves 112c on the semiconductor layer 130, and a process of removing the lower electrode layer 120, the semiconductor layer 130 and the upper electrode layer 140 formed in the peripheral area.

The processes of forming the lower electrode layer 120 having the first separating grooves 112a, the semiconductor layer 130 having the second cell-separating grooves 112b and the upper electrode layer 140 having the third cell-separating grooves 112c are substantially the same as the method of manufacturing the solar cell module 100 described in FIGS. 4A to 4C according to the previous example embodiment in FIG. 1. Thus, the same reference numerals will be used to refer to the same elements as those described in FIGS. 4A to 4C and any further explanation will be omitted.

After a process of forming the lower electrode layer 120 having the first cell-separating grooves 112a, the semiconductor layer 130 having the second cell-separating grooves 112b and the upper electrode layer 140 having the third cell-separating grooves 112c on the transparent substrate 110, a process of removing the lower electrode layer 120, the semiconductor layer 130 and the upper electrode layer 140 by irradiating a laser beam onto the peripheral area PA may be performed. Therefore, the active area AA and the peripheral area PA are electrically and physically separated from each other.

The active area AA and the peripheral area PA may be electrically and physically separated from each other by a trimming process removing the lower electrode layer 120, the semiconductor layer 130 and the upper electrode layer 140 formed in the peripheral area PA, and not having a process of forming peripheral separating grooves in the peripheral area PA.

Figure 13:
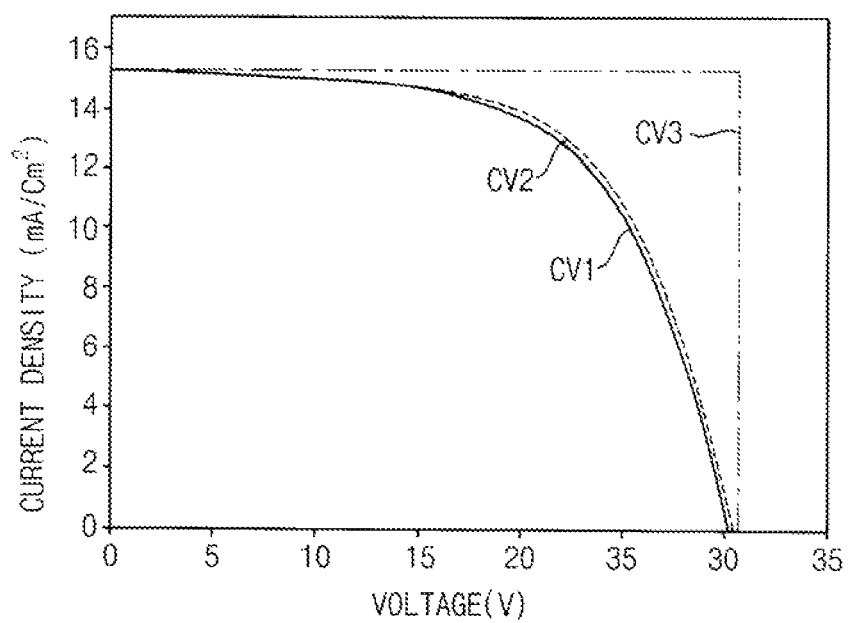
FIG. 13 is a graph showing voltage-current characteristics of each of an example sample and a comparative sample according to one or more embodiments.

FIG. 13 is a graph showing voltage-current characteristics of each of an example sample and a comparative sample according to one or more embodiments.

Referring to FIG. 13, the x-axis represents an open-circuit voltage (Voc), and the y-axis represents a short-circuit current (Jsc). In the example sample corresponding to the solar cell module, a plurality of peripheral separating grooves for insulating the active area from the peripheral area is spaced apart from an area-separating groove separating the active area from the peripheral area as described in the embodiment of FIG. 1. In the comparative sample corresponding to the solar cell module, the peripheral separating grooves are formed to overlap with the area-separating grooves. A curve 1 (CV1) represents voltage-current characteristics of the comparative sample. A curve 2 (CV2) represents voltage-current characteristics of the example sample. A curve 3 (CV3) represents voltage-current characteristics of the maximum output that is obtainable from a solar cell module.

As shown in FIG. 13, it could be seen that the voltage-current characteristics curve 2 (CV2) of the example sample approaches the voltage-current characteristics curve 3 (CV3), which represents the maximum output that is obtainable, in comparison with the voltage-current characteristics curve 1 (CV1) of the comparative sample.

That is, it could be seen that various factors determining characteristics of a solar cell, for example, the open-circuit voltage (Voc), the short-circuit current (Jsc) and a fill factor (FF) are improved when the first peripheral separating grooves insulating the active area from the peripheral area are spaced apart from the area-separating grooves. In this case, the fill factor (FF) is an index representing how the shape of the voltage-electric current approaches a shape of the curve 3 (CV3) in a state in which light is applied to a solar cell module. As shown in FIG. 13, it could be seen that the voltage-current characteristics curve 2 (CV2) of the sample approaches a shape of the curve 3 (CV3) in comparison with the voltage-current characteristics curve 1 (CV1) of the comparative sample.

The foregoing is illustrative of the present disclosure and is not to be construed as limiting thereof. Although a few example embodiments of the present invention have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific example embodiments disclosed, and that modifications to the disclosed example embodiments, as well as other example embodiments, are intended to be included within the scope of the appended claims. The present disclosure is defined by the following claims, with equivalents of the claims to be included therein.

What is claimed is:

1. A solar cell module, comprising:
a substrate;
a lower electrode layer having:
first and second area-separating grooves thereon, the first and second area-separating grooves separating the substrate into an active area and a peripheral area surrounding the active area, the first area-separating groove being proximate to a first end of the active area and the second area-separating groove being proximate to a second end of the active area opposite the first end of the active area, and
first cell-separating grooves in the active area;
a semiconductor layer on the lower electrode layer, the semiconductor layer having second cell-separating grooves thereon, the second cell-separating grooves being spaced apart from the first cell-separating grooves;
an upper electrode layer on the semiconductor layer, the upper electrode layer having third cell-separating grooves thereon, the third cell-separating grooves being spaced apart from the second cell-separating grooves
first dummy cells in the peripheral area, the first dummy cells being spaced apart from the first and second area-separating grooves, wherein each of the first dummy cells has the lower electrode layer, the semiconductor layer, and the upper electrode layer; and
second dummy cells in the peripheral area, the second dummy cells being spaced apart from the first dummy cells, wherein each of the second dummy cells has the lower electrode layer, the semiconductor layer, and the upper electrode layer,
wherein:
a portion of the semiconductor layer is in the first and second area-separating grooves,
the portion of the semiconductor layer in the first area-separating groove directly contacts a first portion of the lower electrode layer in the peripheral area, and the semiconductor layer is completely between the first portion of the lower electrode layer and all of the upper electrode layer that overlaps the first portion of the lower electrode layer,
the portion of the semiconductor layer in the second area-separating groove directly contacts a second portion of the lower electrode layer in the peripheral area, and the semiconductor layer is completely between the second portion of the lower electrode layer and all of the upper electrode layer that overlaps the second portion of the lower electrode layer
the lower electrode layer of each of the second dummy cells directly contacts the portion of the semiconductor layer in the first or second area-separating grooves, and
the semiconductor layer and the upper electrode layer of each of the second dummy cells are spaced apart from the semiconductor layer and the upper electrode layer in the active area.

2. A solar cell module, comprising:
a substrate;
a lower electrode layer having:
first and second area-separating grooves thereon, the first and second area-separating grooves separating the substrate into an active area and a peripheral area surrounding the active area, the first area-separating groove being proximate to a first end of the active area and the second area-separating groove being proximate to a second end of the active area opposite the first end of the active area,
first cell-separating grooves in the active area, and
first peripheral grooves in the peripheral area;
a semiconductor layer having:
second cell-separating grooves thereon, the second cell-separating grooves being spaced apart from the first cell-separating grooves, and
second peripheral grooves in the peripheral area, the second peripheral grooves being connected to the first peripheral grooves; and
an upper electrode layer having:
third cell-separating grooves thereon, the third cell-separating grooves being spaced apart from the second cell-separating grooves, and
third peripheral grooves in the peripheral area, the third peripheral grooves being connected to the second peripheral grooves;
wherein:
a portion of the semiconductor layer is in the first and second area-separating grooves,
the portion of the semiconductor layer in the first area-separating groove directly contacts a first portion of the lower electrode layer in the peripheral area, and the semiconductor layer is completely between the first portion of the lower electrode layer and all of the upper electrode layer that overlaps the first portion of the lower electrode layer, and
the portion of the semiconductor layer in the second area-separating groove directly contacts a second portion of the lower electrode layer in the peripheral area, and the semiconductor layer is completely between the second portion of the lower electrode layer and all of the upper electrode layer that overlaps the second portion of the lower electrode layer.

3. The solar cell module of claim 2, further comprising:
first dummy cells in the peripheral area, the first dummy cells being spaced apart from the first to third peripheral grooves, wherein each of the first dummy cells has the lower electrode layer, the semiconductor layer and the upper electrode layer.

4. The solar cell module of claim 3, further comprising:
second dummy cells in the peripheral area facing the first dummy cells by interposing the first to third peripheral grooves between the first dummy cells and the second dummy cells, wherein:
the second dummy cells includes the lower electrode layer,
the lower electrode layer in each of the second dummy cells has an end portion that faces the first dummy cells, and
the end portion of the lower electrode layer of each of the second dummy cells extends beyond the semiconductor layer and the upper electrode layer in each of the second dummy cells.

5. The solar cell module of claim 3, further comprising:
second dummy cells in the peripheral area facing the first dummy cells by interposing the first to third peripheral grooves between the first dummy cells and the second dummy cells, wherein the second dummy cells includes the lower electrode layer, the semiconductor layer, and the upper electrode layer.

6. The solar cell module of claim 5, wherein the semiconductor layer further has fourth peripheral grooves thereon in the peripheral area, the fourth peripheral grooves being spaced apart from the second peripheral grooves in the peripheral area, and
the upper electrode layer further has fifth peripheral grooves thereon in the peripheral area, the fifth peripheral grooves being connected to the fourth peripheral grooves.

* * * * *